(12) United States Patent
Wang et al.

(10) Patent No.: US 10,964,356 B2
(45) Date of Patent: Mar. 30, 2021

(54) COMPUTE-IN-MEMORY BIT CELL

(71) Applicant: QUALCOMM Incorporated, San Diego, CA (US)

(72) Inventors: Zhongze Wang, San Diego, CA (US); Xia Li, San Diego, CA (US); Ye Lu, San Diego, CA (US); Yandong Gao, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/706,429

(22) Filed: Dec. 6, 2019

(65) Prior Publication Data

US 2021/0005230 A1 Jan. 7, 2021

Related U.S. Application Data

(60) Provisional application No. 62/870,650, filed on Jul. 3, 2019.

(51) Int. Cl.
| | |
|---|---|
| *G11C 7/10* | (2006.01) |
| *G11C 7/06* | (2006.01) |
| *G06N 3/06* | (2006.01) |
| *G11C 11/4094* | (2006.01) |
| *G11C 11/419* | (2006.01) |
| *G11C 11/4074* | (2006.01) |

(52) U.S. Cl.
CPC .............. *G11C 7/065* (2013.01); *G06N 3/06* (2013.01); *G11C 7/106* (2013.01); *G11C 7/1063* (2013.01); *G11C 7/1087* (2013.01); *G11C 11/4074* (2013.01); *G11C 11/4094* (2013.01); *G11C 11/419* (2013.01)

(58) Field of Classification Search
CPC ....... G11C 7/065; G11C 7/106; G11C 7/1063; G11C 7/1087
USPC ..................................................... 365/189.05
See application file for complete search history.

(56) References Cited

U.S. PATENT DOCUMENTS

| | | | |
|---|---|---|---|
| 2005/0141265 A1* | 6/2005 | Yokoyama | G11C 11/4125 365/154 |
| 2008/0273382 A1 | 11/2008 | Wang | |
| 2010/0006912 A1* | 1/2010 | Larsen | H01L 27/1203 257/296 |
| 2014/0075087 A1* | 3/2014 | Bartling | H03K 3/3562 711/102 |
| 2014/0219039 A1 | 8/2014 | Jung et al. | |

(Continued)

FOREIGN PATENT DOCUMENTS

CN 103971731 B 11/2017

OTHER PUBLICATIONS

International Search Report and Written Opinion—PCT/US2020/035590—ISA/EPO—dated Aug. 24, 2020.

*Primary Examiner* — Vu A Le
(74) *Attorney, Agent, or Firm* — Muncy, Geissler, Olds & Lowe, P.C./Qualcomm

(57) ABSTRACT

A charge sharing Compute In Memory (CIM) may comprise an XNOR bit cell with an internal capacitor between the XNOR output node and a system voltage. Alternatively, a charge sharing CIM may comprise an XNOR bit cell with an internal capacitor between the XNOR output node and a read bit line. Alternatively, a charge sharing CIM may comprise an XNOR bit cell with an internal cap between XNOR and read bit line with a separate write bit line and write bit line bar.

30 Claims, 11 Drawing Sheets

(56) References Cited

U.S. PATENT DOCUMENTS

| | | | |
|---|---|---|---|
| 2014/0362636 A1* | 12/2014 | Erickson | G11C 5/005 |
| | | | 365/149 |
| 2019/0042199 A1 | 2/2019 | Sumbul et al. | |
| 2019/0088309 A1 | 3/2019 | Li et al. | |
| 2019/0102359 A1 | 4/2019 | Knag et al. | |

\* cited by examiner

| Memory Type | Flash | PCM | RRAM | CS-SRAM |
|---|---|---|---|---|
| Storage Mechanism | Charge store in floating gate | GCT phase change | Resistance switch of TMO | CMOS Latch |
| Multiplication | $I = I \times W(Vt)$ | $I = V \times G$ | $I = V \times G$ | $Q = C \times V$ |
| Accumulation | $\Sigma^I$ | $\Sigma^I$ | $\Sigma^I$ | $\Sigma^Q$ |
| Non Volatile | Yes | Yes | Yes | No |
| Process limitation | Specialty eFlasch 40mm and larger node | Embedded PCM not available | Available in 40 & 22nm mode | No limitation |
| MAC Energy Efficiency | Very high | Very high | High | Very high |
| Area | Small | Small | Small | Large |
| Multi-level cell | Excellent | Good | Poor | No multi-bit support doesn't require multi-level memory cell |

FIG. 2

| CIM Type | Current Domain | Charge Domain |
|---|---|---|
| Multiplication | $I = I_{READ} \times (1/0)$ | $Q = C \times V$ |
| Accumulation | $\Sigma^{I}_{READ}$ | $\Sigma^{Q}$ |
| Sensitivity to PVT Variation | Very sensitive | Not sensitive |
| Variation source | PVT, VtMM, ADC offset, noise | Cap mismatch ADC offset, noise |
| Energy Efficiency | Good | Better |
| Linearity | Poor | Good |
| Process node scalability | Current doesn't scale well | Capacitance scales well |
| Additional challenges | $I_{READ}$ has to be small (uA) IR drop cross BL Timing critical | Data retention |

FIG. 3

| PCWL1N | PCWL2N | PCWL1P | PCWL2P | N1 | N2 | Node_0 |
|---|---|---|---|---|---|---|
| 1 | 0 | 0 | 1 | 1 | 0 | 1 |
| 1 | 0 | 0 | 1 | 0 | 1 | 0 |
| 0 | 1 | 1 | 0 | 1 | 0 | 0 |
| 0 | 1 | 1 | 0 | 0 | 1 | 1 |

COMPUTE-IN-MEMORY BIT CELL

CROSS-REFERENCE TO RELATED APPLICATIONS

The present Application for Patent claims the benefit of Provisional Application No. 62/870,650 entitled "COMPUTE-IN-MEMORY BIT CELL" filed Jul. 3, 2019, assigned to the assignee hereof, and expressly incorporated herein by reference in its entirety.

FIELD OF DISCLOSURE

This disclosure relates generally to bit cells, and more specifically, but not exclusively, to charge sharing compute in memory (CIM) bit cells.

BACKGROUND

As computing systems become more complex, the computing systems process larger amounts of data during operation. This leads to challenges involving the retrieval and storage of data in storage devices. For example, computing systems use multiple layers of computational nodes, where deeper layers perform computations based on results of computations performed by higher layers. These computations sometimes may rely on the computation of dot-products and absolute difference of vectors, typically computed with multiply and accumulate (MAC) operations performed on the parameters, input data and weights. Because these complex computing system operations may include many such data elements, these data elements are typically stored in a memory separate from processing elements that perform the MAC operations.

The computation of operations within a processor is typically orders of magnitude faster than the transfer of data between the processor and memory resources used to store the data. Placing all the data closer to the processor in caches is prohibitively expensive for the great majority of practical systems due to the need for large data capacities of close proximity caches. Thus, the transfer of data when the data is stored in a memory separate from processing elements becomes a major bottleneck for computing system computations. As the data sets increase in size, the time and power/energy a computing system uses for moving data between separately located memory and processing elements can end up being multiples of the time and power used to actually perform the computations. Thus, there exists the need for computing systems that reduce or avoid transferring data for use in a computing operation.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a bit cell circuit comprises: a bit cell coupled to a system voltage and a ground; a first signal line coupled to the bit cell; a second signal line coupled to the bit cell; a third signal line coupled to the bit cell; a fourth signal line coupled to the bit cell; a read transistor coupled to a first read signal line, an output of the bit cell, and a first read bit line; and a capacitor coupled to the bit cell output and the system voltage.

In another aspect, a bit cell circuit comprises: a bit cell coupled to a system voltage and a ground; a first signal line coupled to the bit cell; a second signal line coupled to the bit cell; a third signal line coupled to the bit cell; a fourth signal line coupled to the bit cell; a read transistor coupled to a first read signal line, an output of the bit cell, and the ground; and a capacitor coupled to the bit cell output and the read bit line.

In still another aspect, a bit cell circuit comprises: a bit cell coupled to a system voltage and a ground; a first signal line coupled to the bit cell; a second signal line coupled to the bit cell; a third signal line coupled to the bit cell; a fourth signal line coupled to the bit cell; a read transistor coupled to a first read signal line, an output of the bit cell, and a write bit line bar; a write bit line coupled to third signal line and the fourth signal line; and a capacitor coupled to the bit cell output and the read bit line.

In still another aspect, a method for operating a bit cell circuit comprises: resetting the bit cell circuit to an initial state; applying a first voltage signal to a first signal line; applying a second voltage signal to a second signal line; coupling a first read bit line to an output of the bit cell circuit; and sampling a voltage level of the first read bit line.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIG. 2 illustrates exemplary CIM memory types in accordance with some examples of the disclosure;

FIG. 3 illustrates an exemplary SRAM CIM memory types in accordance with some examples of the disclosure;

Figure 1:
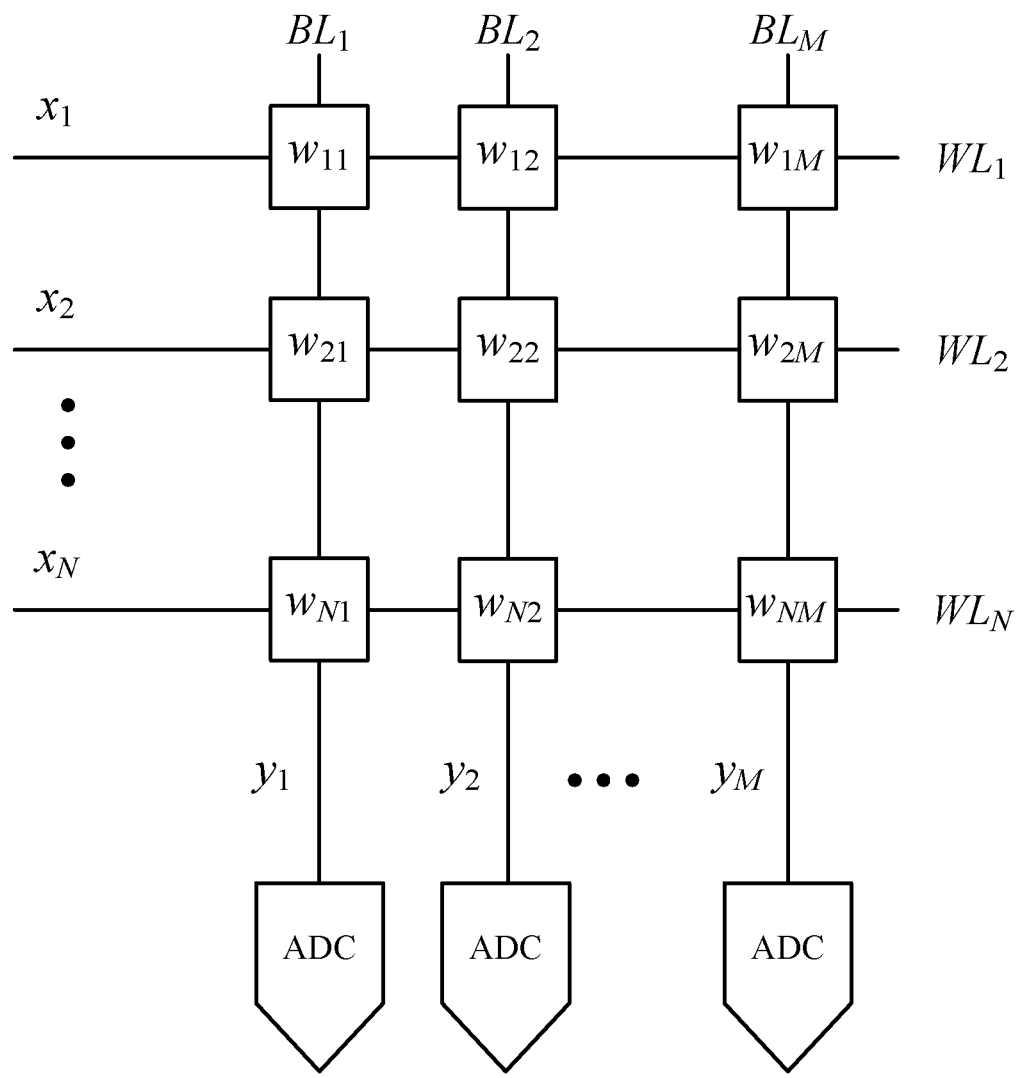
FIG. 1 illustrates an exemplary CIM bit cell array in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. For example, a charge sharing Compute In Memory (CIM) (also known as In Memory Compute or Process In Memory) may comprise a complement of an exclusive OR (XNOR) CIM bit cell with an internal capacitor between the XNOR output node and a system voltage. In another example, a charge sharing (also known as switch capacitance based or more generally charge based) CIM may comprise an XNOR bit cell with an internal capacitor between the XNOR output node and a read bit line. In such examples, a CIM circuit may eliminate the need for a dedicated write port for the XNOR bit cell, use the transmission gate for an XNOR CIM bit cell to generate a definite voltage at an internal capacitor that avoids a floating node, and is a smaller cell than conventional XNOR bit cells that uses only 4 signal line vertical pins and 2 horizontal (read bit line (RBL) & read word line (RWL)) pins. In still another example, a charge sharing CIM may comprise an XNOR CIM bit cell with an internal capacitor between XNOR and read bit line with a separate write bit line and write bit line bar. In this example, a CIM circuit may eliminate SRAM write port BL and BLB and not use 6T SRAM, use a separate write bit line (WBL) and write bit line bar (WBLB—the complement of the write bit line) and write word lines (WWLs) to generate a definite voltage at an internal capacitor that avoids a floating node, and is a smaller cell than conventional XNOR CIM bit cells that uses only 5 signal line pins and 1 (WBL) horizontal pin, 2 (RBL & WBLB) vertical pins.

The exemplary CIM circuits described herein both reduce energy for data movement and increase an effective memory bandwidth for data consumed in computing systems. The exemplary CIM circuits can perform operations such as dot-product and absolute difference of vectors locally stored within an array of memory cells (e.g., bit cells) without having to send data to a host processor. The exemplary CIM circuits may perform MAC operations within a CIM circuit to enable a higher throughput for dot-product operations or weight matrices while still providing higher performance and lower energy compared to continually moving data from memory for inputs in computations by a host processor. The exemplary CIM circuits may include a local memory processor to perform processing to return a computation result instead of merely returning raw or unprocessed data. In some examples, a processor in the CIM circuit computes a MAC value based on a charge or current from selected bit cells of a column of a memory array, the memory array also included in the CIM circuit. It will be noted that the abbreviation "MAC" can refer to multiply-accumulate, multiplication/accumulation, or multiplier accumulator, in general referring to an operation that includes the multiplication of two values, and the accumulation of a sequence of multiplications.

According to some examples, use of a CIM circuit reduces the amount of data that is typically transferred between system memory and compute resources. The reduction in data movement accelerates the execution of algorithms that may be memory bandwidth limited if not for the use of a CIM circuit. The reduction in data movement also reduces overall energy consumption associated with data movement within the computing device. In some examples, processing elements of a CIM circuit may compute a MAC value via use of current summing for one or more columns of bit cells of an array included in the CIM circuit. For these examples, current summing may include doing the following: 1) multiple bit cell pass gates (PGs) simultaneously pulling down a pre-charged bit line of a column having accessed bit cells; and 2) interpret the final bit line voltage as an analog output value.

There are many useful applications for CIM bit cell arrays including, but not limited to, computer artificial intelligence (AI) that use machine learning such as deep learning techniques. With deep learning, a computing system organized as a neural network computes a statistical likelihood of a match of input data with prior computed data. A neural network refers to a plurality of interconnected processing nodes that enable the analysis of data to compare an input to "trained" data. Trained data refers to computational analysis of properties of known data to develop models to use to compare input data. An example of an application of AI and data training is found in object recognition, where a system analyzes the properties of many (e.g., thousands or more) of images to determine patterns that can be used to perform statistical analysis to identify an input object such as a person's face. Such neural networks may compute "weights" to perform computations on new data (an input data "word") with multiple layers of computational nodes that rely on the MAC operations performed on the input data and weights. For example, CIM bit cell arrays may be used as hardware accelerators for neural networks (e.g., neural processing unit (NPU)).

It should be noted that the terms "connected," "coupled," or any variant thereof, mean any connection or coupling, either direct or indirect, between elements, and can encompass a presence of an intermediate element between two elements that are "connected" or "coupled" together via the intermediate element. It should also be understood that "coupled" or "connected" as used herein mean electrically coupled or electrically connected unless stated otherwise.

It should be noted that the terms "system voltage" and "ground" refer to voltage states of a circuit. In a circuit coupled to an operating power supply of 5 volts, for example, the system voltage (3.5 volts to 5 volts) indicates a "high" logic state while the ground (0 volts to 1.5 volts) indicates a "low" logic state. With regard to system voltage, it should be understood that system voltage as used herein refers to the operating voltage of the bit cell or memory array (sometimes referred to a nominal voltage that a device or system was designed to operate at). For example, a memory bit cell may reside in a system with a processor wherein the memory bit cell has a system voltage (operating voltage) of 1.5 volts while the processor has a system voltage (operating voltage) of 3.3 volts. In this example, it is well understood in the art that the processor signals are voltage reduced when applied to the memory bit cell from a system voltage of 3.3 volts to a system voltage of 1.5 volts. Thus, the system voltage as used herein applies to the system or operating voltage of the memory array or bit cell unless otherwise stated.

FIG. 1 illustrates an exemplary CIM bit cell array. As shown in FIG. 1, a CIM bit cell array 100 may include a plurality of bit cells W11-Wnm arranged in an array, a first activation input X1, a second activation input X2, an nth activation input Xn, a first output Y1, a second output Y2, and an mth output Ym. The first activation input X1 is coupled to a first signal line (word line—WL1), the second activation input X2 is coupled to a second signal line (word line—WL2), the nth activation input Xn is coupled to an nth signal line (word line—WLn). The first output Y1 is coupled to a first bit line (BL1) and an analog to digital converter (ADC), the second output Y2 is coupled to a second bit line (BL2) and an ADC, and an mth output Ym is coupled to a mth bit line (BLm) and an ADC.

Each of the bit cells W11-Wnm stores a value corresponding to a weight. An activation signal (Activation ($X_n$) is driven by a voltage pulse on respective wordlines (WLn) and multiplication happens at each bit cell (W11-Wnm) and the results are output to the bit lines (BLm). Each bit line (BL1, BL2, BLm) sums up each bit cells' output (each bit cell's output adds voltage to the respective bit line) and passes the result to respective ADC and the ADC converts each BL result to a digital value in accordance with $y_j = \Sigma w_{ij} x_i$. The multiplication occurs as a result of a vector-matrix operation. For example, data may be stored in the cell array 100 in a column major format such that the most significant bit (MSB) is the topmost first signal line (WL1) and the least significant bit (LSB) is the bottommost nth signal line (WLn) while the rightmost column is the most significant column and the leftmost column is the least significant column. In artificial neural networks, for instance, the matrix elements W11-Wnm correspond to weights, or synapses, between neuron. Each bit cell W11-Wnm may store a value (one or zero) corresponding to a data word for a particular signal line (WL1-W1n). By activating a particular combination of signal lines, a vector-matrix multiplication operation may be performed. Each activated bit cell W11-Wnm that stores a logical "one" will contribute some voltage level (e.g., if the bit cell voltage is 1 volt, the bit cell may contribute less than 1 volt, such as 10 or 20 millivolts) to the activated bit cell's respective bit line (BL1-BLm). Each activated bit cell W11-Wnm that stores a logical "zero" will not contribute any voltage potential to the activated bit cell's respective bit line (BL1-BLm). The ADC for each bit line (BL1-BLm) will convert the analog voltage level on the bit line to a digital value as an output of the vector-matrix multiplication operation.

FIG. 2 illustrates exemplary CIM memory types. As shown in FIG. 2, many different types of memory are candidates for a CIM bit cell array. FIG. 2 illustrates the benefits and drawbacks of four main types of bit cells: Flash memory, phase change memory (PCM), resistive random access memory (RRAM), and charge sharing static random access memory (CS-SRAM). As shown, the storage mechanism for each type of memory is indicated: charge stored in a floating gate (Flash), a GST (GeSbTe—germanium-antimony-tellurium) phase change (PCM), resistance switch of a TMO (transition metal oxide—RRAM), and a CMOS latch. As indicated in the "Accumulation" row, the first three memory types are shown as current accumulation and the fourth is shown as charge accumulation. However, it should be understood that a CS-SRAM may be configured as a charge or current accumulator (See FIG. 3, for example). As indicated in the "Process limitation" row, the CS-SRAM has no process limitations on node size and very high MAC energy efficiency along with good parameters in other categories. In addition, as indicated in FIG. 3, the CS-SRAM configured as a charge accumulator will scale well in terms of the number of nodes in addition to the lack of process limitations on the size of each node. Thus, with no process limitations on the size of a node as well as the MAC energy efficiency, and multi-bit support without the need for a multi-level layout, the CS-SRAM offers the better performance of the different illustrated memory types.

FIG. 3 illustrates an exemplary SRAM CIM memory types. As indicated in FIG. 2, the CS-SRAM memory type offers benefits over other possible memory types for use in CIM arrays. As shown in FIG. 3, an SRAM may be configured as a CIM bit cell array with current accumulation on the bit line or charge accumulation on the bit line. For the current accumulation configuration, the bit cells with a logical "one" contribute current to the respective bit lines and this current is read as the output for that bit line of the array. As indicated in the Sensitivity to process, voltage and temperature (PVT) variation row, the current accumulation configuration is more sensitive to PVT variations that may cause delays in the signal timing under different conditions. For the current accumulation configuration, these variation sources include PVT, Threshold Voltage Mismatch (VtMM), ADC offset, and noise. In contrast, the charge accumulation configuration is subject only to capacitance mismatch between bit cells, ADC offset, and noise variation sources. As indicated in the Energy efficiency and linearity row, the charge accumulation configuration shows better performance than the current accumulation configuration. In addition, the number of nodes or size of the array scales well for the charge accumulation configuration but not for the current accumulation configuration as indicated in the Process node scalability row. Furthermore, the current accumulation configuration has additional challenges such keeping the accumulated current small and critical timing issues while the charge accumulation configuration may have challenges only with data retention. Thus, as can be seen in FIG. 3, an SRAM configured to use charge accumulation provides better performance across the various categories (i.e., a CS-SRAM) making an CS-SRAM a good candidate for a CIM bit cell array.

Figure 4:
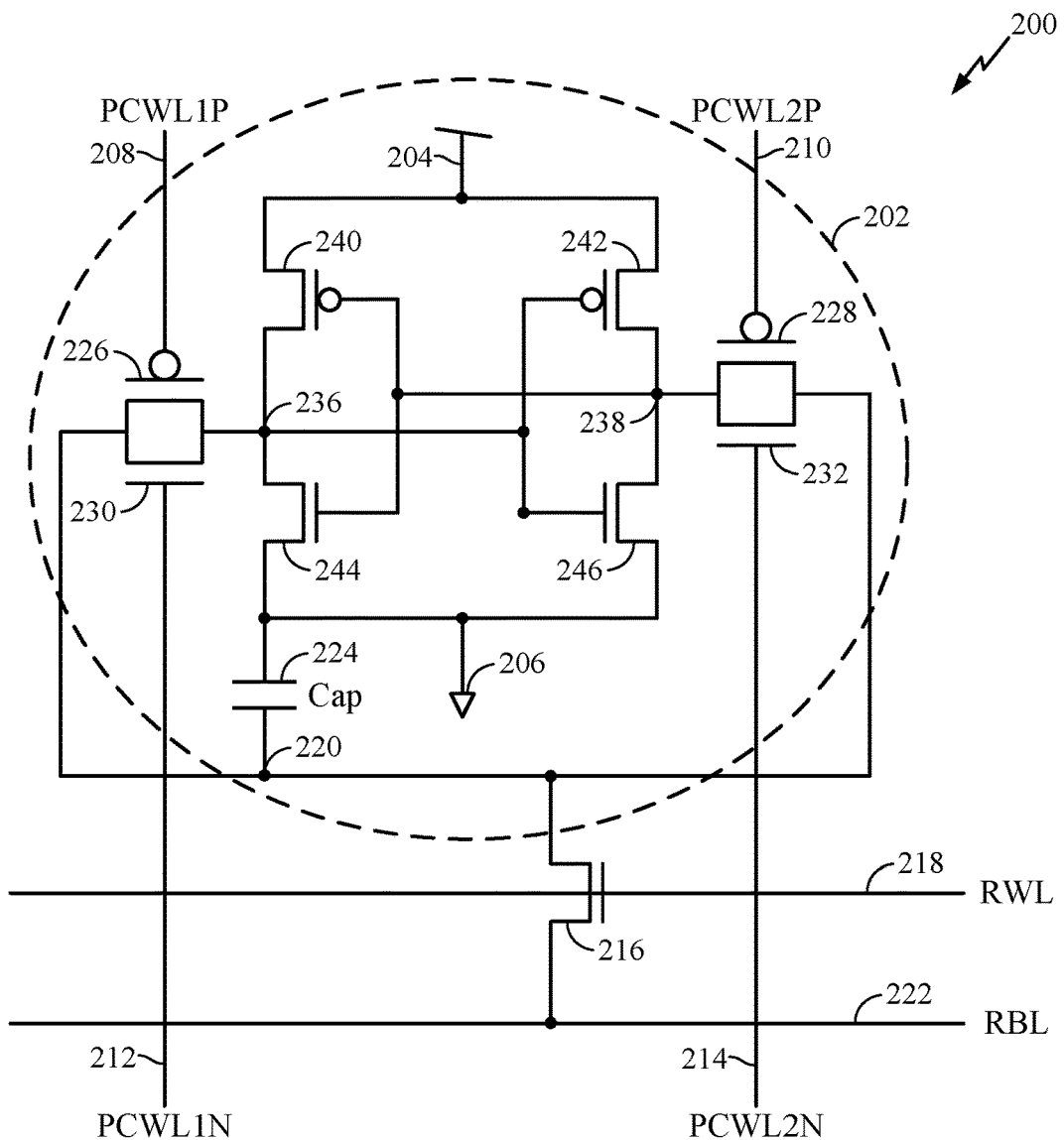
FIG. 4 illustrates an exemplary XNOR CIM bit cell with an internal capacitor between the bit cell and a system voltage in accordance with some examples of the disclosure.

FIG. 4 illustrates an exemplary XNOR bit cell with an internal capacitor between the bit cell and a system voltage in accordance with some examples of the disclosure. As shown in FIG. 4, a bit cell circuit 200 may include a bit cell 202 coupled to a system voltage 204 (a logical "one" of 3.5 volts to 5 volts, for example) and a ground 206 (a logical "zero" of 0 volts to 1.5 volts, for example). The bit cell circuit 200 may also include a first signal line 208 (pre-charge word line 1P, PCWL1P) coupled to the bit cell 202, a second signal line 210 (pre-charge word line 2P, PCWL2P)

coupled to the bit cell 202, a third signal line 212 (pre-charge word line 1N, PCWL1N) coupled to the bit cell 202, a fourth signal line 214 (pre-charge word line 2N, PCWL2N) coupled to the bit cell 202, a read transistor 216 coupled to a first read word line 218, an output 220 of the bit cell 202, a first read bit line 222, and a capacitor 224 coupled to the bit cell output 220 and the system voltage 204.

As shown in FIG. 4, the bit cell 202 may include a first transistor 226 coupled to the first signal line 208, a second transistor 228 coupled to the second signal line 210, a third transistor 230 coupled to the third signal line 212, and a fourth transistor 232 coupled to the fourth signal line 214. These four transistors are configured to operate as transmission pass gates for the bit cell 202. As is well understood in the art, a transmission pass gate is analog gate similar to a relay that can conduct in both directions or block by a control signal. As shown in FIG. 4, the first transistor 226 and the second transistor 228 pass a strong "1" but poor "0", and the third transistor 230 and the fourth transistor 232 passes a strong "0" but poor "1." As shown in FIG. 4, the first transistor 226 is a P type transistor, the second transistor 228 is a P type transistor, the third transistor 230 is an N type transistor, and a fourth transistor 232 is an N type transistor.

As shown in FIG. 4, the bit cell 202 may include a fifth transistor 240 (P type), a sixth transistor 242 (P type), a seventh transistor 244 (N type), and an eighth transistor 246 (N type). The bit cell circuit 200 is configured as a XNOR logic device with a truth table 234 with a first internal node (N1) 236 and a second internal node (N2) 238. The bit cell 202 may be an SRAM memory cell. Alternatively, the transistors 240-246 may be illustrated as two cross-coupled inverters (See FIG. 6, for example). This simple loop creates a bi-stable circuit with a stable state (a logical "1" or a logical "0") that does not change over time as is well known in the art.

To read the contents of the bit cell 202, the transistors 226-232 must be turned on/enabled and when the transistors 226-232 receive voltage to their gates from their respective signal lines (i.e., first signal line 208, second signal line 210, third signal line 212, and fourth signal line 214), the transistors 226-232 become conductive and so the value stored get transmitted to the read bit line 222. If the bit cell 202 stores a logical "1", the bit cell output 220 will contribute a voltage level to the read bit line 222. If the bit cell 202 stores a logical "0", the bit cell output 220 will not contribute a voltage level to the read bit line 222. When multiple bit cells 202 are configured in an array (See FIG. 7, for example), the read bit line 222 will accumulate a voltage contribution from each bit cell 202 that stored a logical "1" and read that accumulated voltage level as an output of the array.

Figure 5:
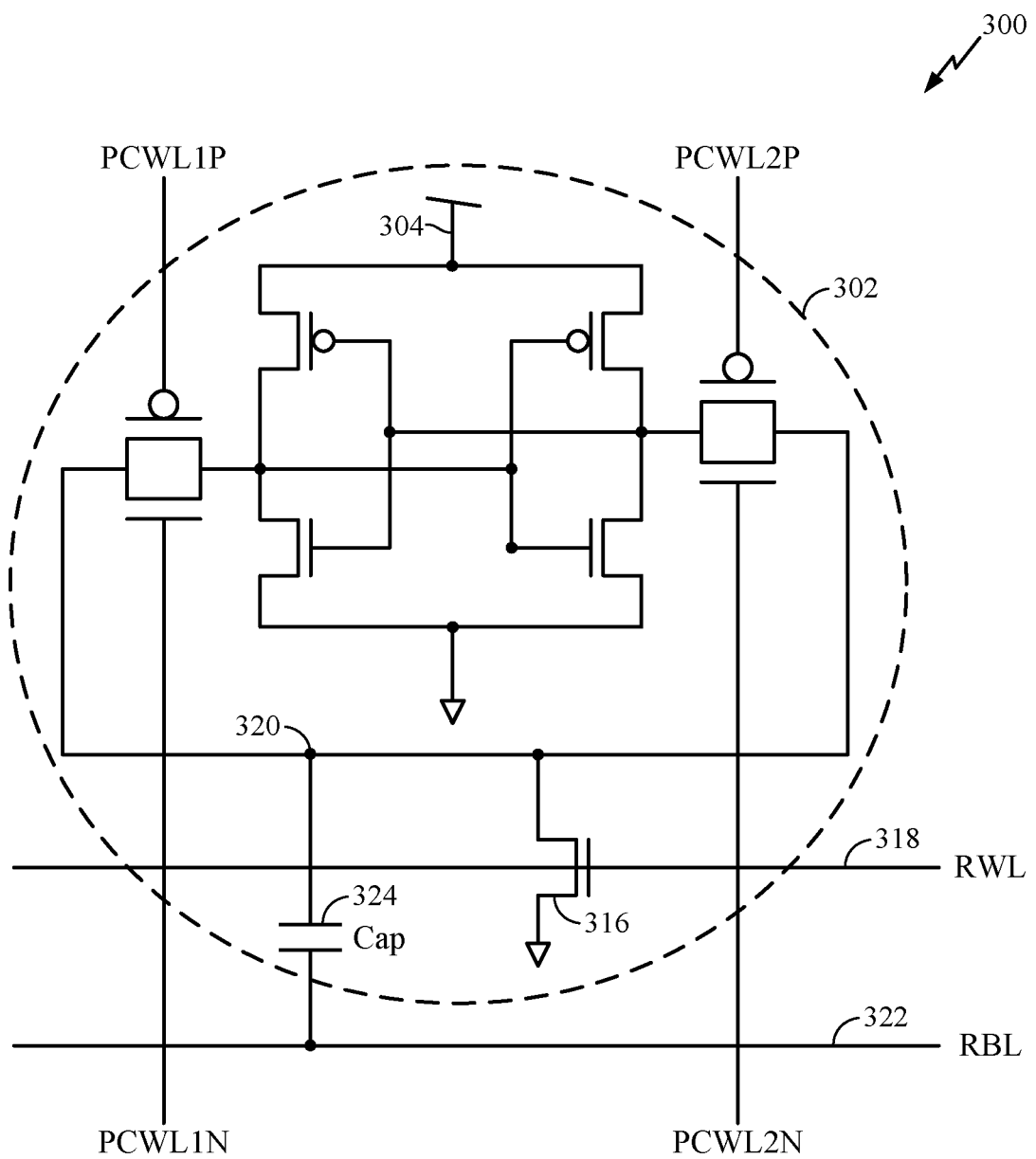
FIG. 5 illustrates an exemplary XNOR CIM bit cell with an internal capacitor between the bit cell and a read bit line in accordance with some examples of the disclosure.

FIG. 5 illustrates an exemplary XNOR bit cell with an internal capacitor between the bit cell and a read bit line in accordance with some examples of the disclosure. As shown in FIG. 5, a bit cell circuit 300 includes similar elements as the bit cell circuit 200 with the exception that the capacitor 324 is coupled between the bit cell output 320 and the first read bit line 322 and the read transistor 316 is coupled to the bit cell 302, the first read word line 318. In this configuration within a CIM bit cell array, the first read word line 318 on the selected column is turned on to discharge any voltage remaining on internal capacitor 324, P channel transmission gate on left 326 or right 328 is turned on depends on data 1 or 0 and desired data state is written into the bit cell 302. In some examples, a write assist may be used to minimize the cell size. This may include an over drive of the first read word line 318, a lower system voltage 304, over driving of the nch PCWL 1 or 2. In addition, the capacitor 324 may be used for write assistance by first read bit line 322 with a first read bit line 322 pulse to aid the write operation.

Figure 6:
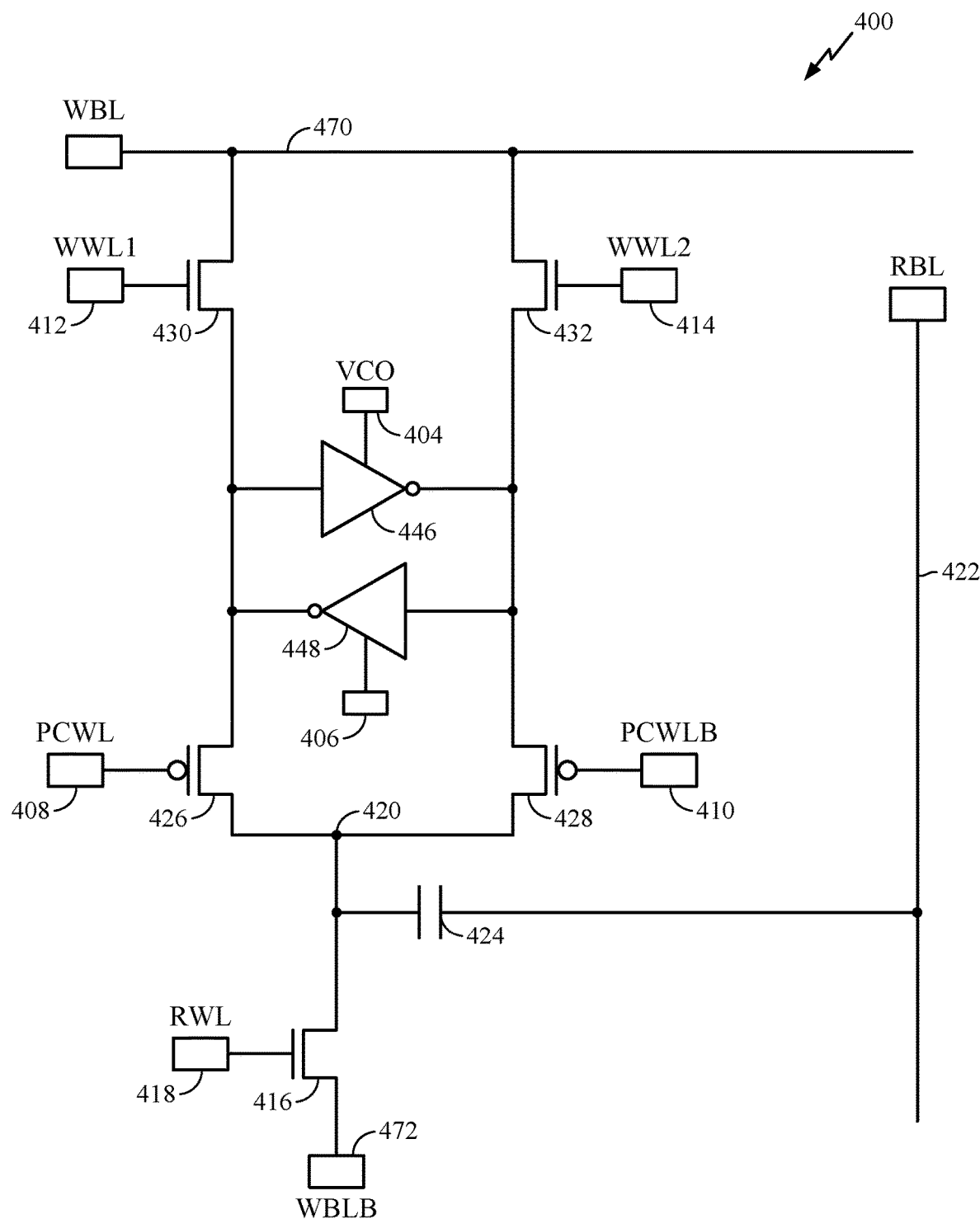
FIG. 6 illustrates an exemplary XNOR CIM bit cell with an internal capacitor between the bit cell and a read bit line and separate write bit line in accordance with some examples of the disclosure.

FIG. 6 illustrates an exemplary XNOR CIM bit cell with an internal capacitor between the bit cell and a read bit line and separate write bit line in accordance with some examples of the disclosure. As shown in FIG. 6, a bit cell circuit 400 may include a bit cell 402 coupled to a system voltage 404 and a ground 406. The bit cell circuit 400 may also include a first signal line 408 coupled to the bit cell 402, a second signal line 410 coupled to the bit cell 402, a first write signal line 412 coupled to the bit cell 402, a fourth write signal line 414 coupled to the bit cell 402, a read transistor 416 coupled to a first read signal line 418, an output 420 of the bit cell 402, a first read bit line 422, and a capacitor 424 coupled to the bit cell output 420 and the first read bit line 422. The bit cell circuit 400 may also include a write bit line 470 and a write bit line bar 472. As shown in FIG. 6, the bit cell 402 may include a first inverter 446 cross coupled to a second inverter 448, a first transistor 426 coupled to a first signal line 408, a second transistor 428 coupled to the second signal line 410, a third transistor 430 coupled to the third signal line 412, and a fourth transistor 432 coupled to the fourth signal line 414. As shown in FIG. 6, the first transistor 426 is a P type transistor, the second transistor 428 is a P type transistor, the third transistor 430 is an N type transistor, and a fourth transistor 432 is an N type transistor.

Figure 7:
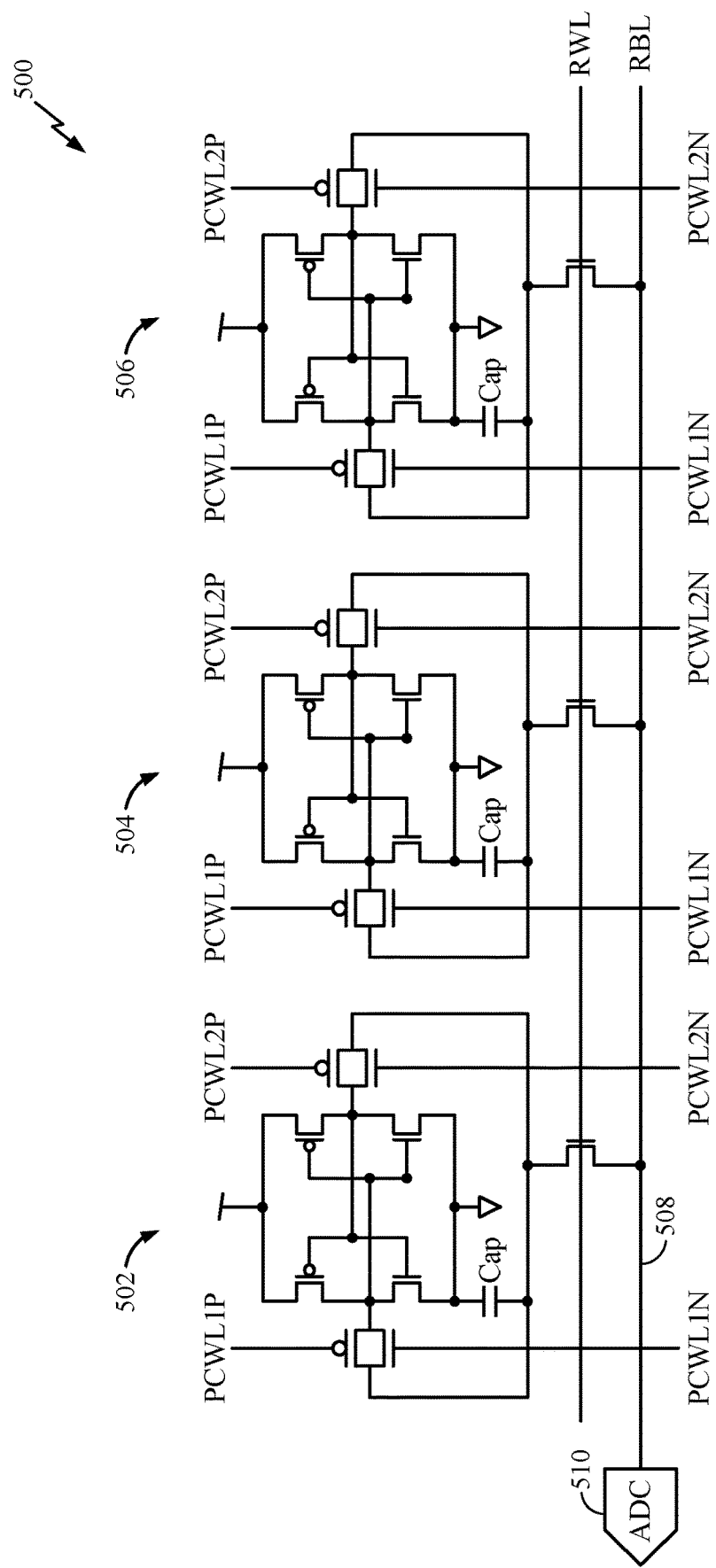
FIG. 7 illustrates an exemplary charge sharing CIM bit cell array with an internal capacitor between the bit cell and a system voltage in accordance with some examples of the disclosure.

FIG. 7 illustrates an exemplary charge sharing CIM bit cell array with an internal capacitor between the bit cell and a system voltage in accordance with some examples of the disclosure. As shown in FIG. 7, a bit cell circuit 500 may include a first bit cell 502 (e.g., bit cell 202), a second bit cell 504 (e.g., bit cell 202), and a third bit cell 506 (e.g., bit cell 202) arranged in an array. The outputs from each bit cell 502-506 may be read on the first read bit line 508, then summed and converted to a digital signal by a first ADC 510. As shown, a popcount accumulation may include charge sharing across the first read bit line 508 and the first ADC 510 readout of the first read bit line 508 voltage level. In addition, both transmission gates of each bit cell may be turned off to reduce leakage in a standby mode. In this configuration within a CIM bit cell array, the CIM bit cell rows may be read simultaneously and written one row at a time (instead of one row at a time in typical SRAM). For example, one row is defined by PCWL1P to PCWL1N, and a second row is defined by PCWL2P to PCWL2N, etc.

Figure 8:
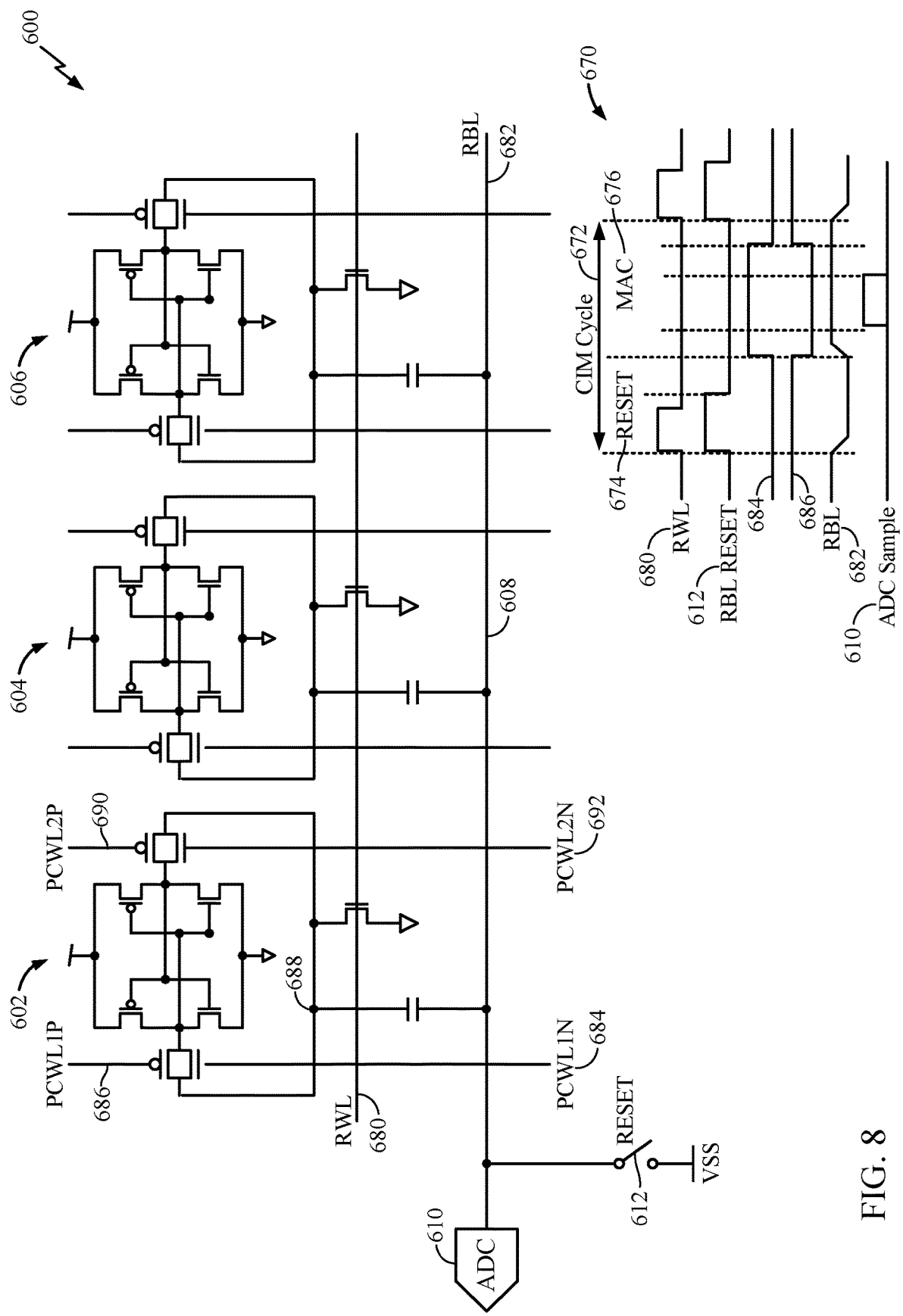
FIG. 8 illustrates an exemplary charge sharing CIM bit cell array with an internal capacitor between the bit cell and a read bit line in accordance with some examples of the disclosure.

FIG. 8 illustrates an exemplary charge sharing CIM bit cell array with an internal capacitor between the bit cell and a read bit line in accordance with some examples of the disclosure. As shown in FIG. 8, a bit cell circuit 600 may include a first bit cell 602 (e.g., bit cell 302), a second bit cell 604 (e.g., bit cell 302), and a third bit cell 606 (e.g., bit cell 302) arranged in an array. The outputs from each bit cell 602-606 may be read on the first read bit line 608, then summed and converted to a digital signal by a first ADC 610. In addition, a reset switch 612 coupled to the ground 614 may be included to reset the bit cell circuit 600. As shown, another way to implement a MAC operation may include resetting the first read bit line 608 and each cell node to ground while the transmission gates remain off. The activation input drives PCWL N/P respectively in a XNOR operation and the bit cell output becomes either the system voltage or ground as a result while the first read bit line 608 voltage will be readout by the first ADC 610.

As shown in FIG. 8, a timing diagram 670 illustrates a CIM cycle 672 of the bit cell circuit 600. In an initial reset phase 674, the reset switch 612 is activated to reset the read bit line 682 to an initial state (e.g., ground) with the read word line 680 transitioning to a logical high (i.e., activate or turn on) and read bit line 682 transitioning to a logical low (i.e., coupled to ground) as shown. This is followed by a MAC operation phase 676. As shown in the example timing diagraph 670, a first signal line 686 (i.e., PCWL1P) is turned on to transition to a logical low state and a second signal line 684 (i.e., PCWL1N) is turned on to transition to a logical high state. After the first signal line 686 and the second signal line 684 are turned on, the output 688 of the bit cell 602 is coupled to the read bit line 682 (shown as a logical "1") to increase the voltage level on the read bit line 682. The first ADC 610 may then be sampled to read the value of the MAC operation. The voltage signals applied to the signal lines, such as the first signal line 686 and the second signal line 684 in this example, may be configured to correspond to an input state of that signal line to generate a bit cell output in accordance with the MAC operation desired. See, for example, the truth table of FIG. 4 where the combination of voltage signals of a logical "1" or "0" result in an XNOR output of the bit cell.

With regard to sampling a voltage at the ADC, this refers to an instantaneous voltage reading or signal value at the ADC. An ADC converts a continuous-time and continuous-amplitude analog signal to a discrete-time and discrete-amplitude digital signal. The conversion involves quantization of the input, so it necessarily introduces a small amount of error or noise. Furthermore, instead of continuously performing the conversion, an ADC does the conversion periodically, sampling the input, limiting the allowable bandwidth of the input signal. The performance of an ADC is primarily characterized by its bandwidth and signal-to-noise ratio (SNR). The bandwidth of an ADC is characterized primarily by its sampling rate. The SNR of an ADC is influenced by many factors, including the resolution, linearity and accuracy (how well the quantization levels match the true analog signal), aliasing and jitter. ADCs are chosen to match the bandwidth and required SNR of the signal to be digitized. If an ADC operates at a sampling rate greater than twice the bandwidth of the signal, then per the Nyquist-Shannon sampling theorem, perfect reconstruction is possible. The presence of quantization error limits the SNR of even an ideal ADC. However, if the SNR of the ADC exceeds that of the input signal, its effects may be neglected resulting in an essentially perfect digital representation of the analog input signal.

The analog signal is continuous in time and it is necessary to convert this to a flow of digital values. It is therefore required to define the rate at which new digital values are sampled from the analog signal. The rate of new values is called the sampling rate or sampling frequency of the converter. A continuously varying band limited signal can be sampled (in other words, the instantaneous signal values at intervals of time T, the sampling time, are measured and potentially stored) and then the original signal can be reproduced from the discrete-time values by an interpolation formula. The accuracy in this procedure is dictated by the combined effect of sampling and quantization. In the limit of high ADC quantizer resolution, the Shannon-Nyquist sampling theorem implies that a faithful reproduction of the original signal is only possible if the sampling rate is higher than twice the highest frequency of the signal. For a finite quantizer resolution, sampling rates lower than twice the highest frequency usually lead to the optimal digital representation. Since a practical ADC cannot make an instantaneous conversion, the input value must necessarily be held constant during the time that the converter performs a conversion (called the conversion time). An input circuit called a sample and hold performs this task—in most cases by using a capacitor to store the analog voltage at the input, and using an electronic switch or gate to disconnect the capacitor from the input. Many ADC integrated circuits include the sample and hold subsystem internally.

Figure 9:
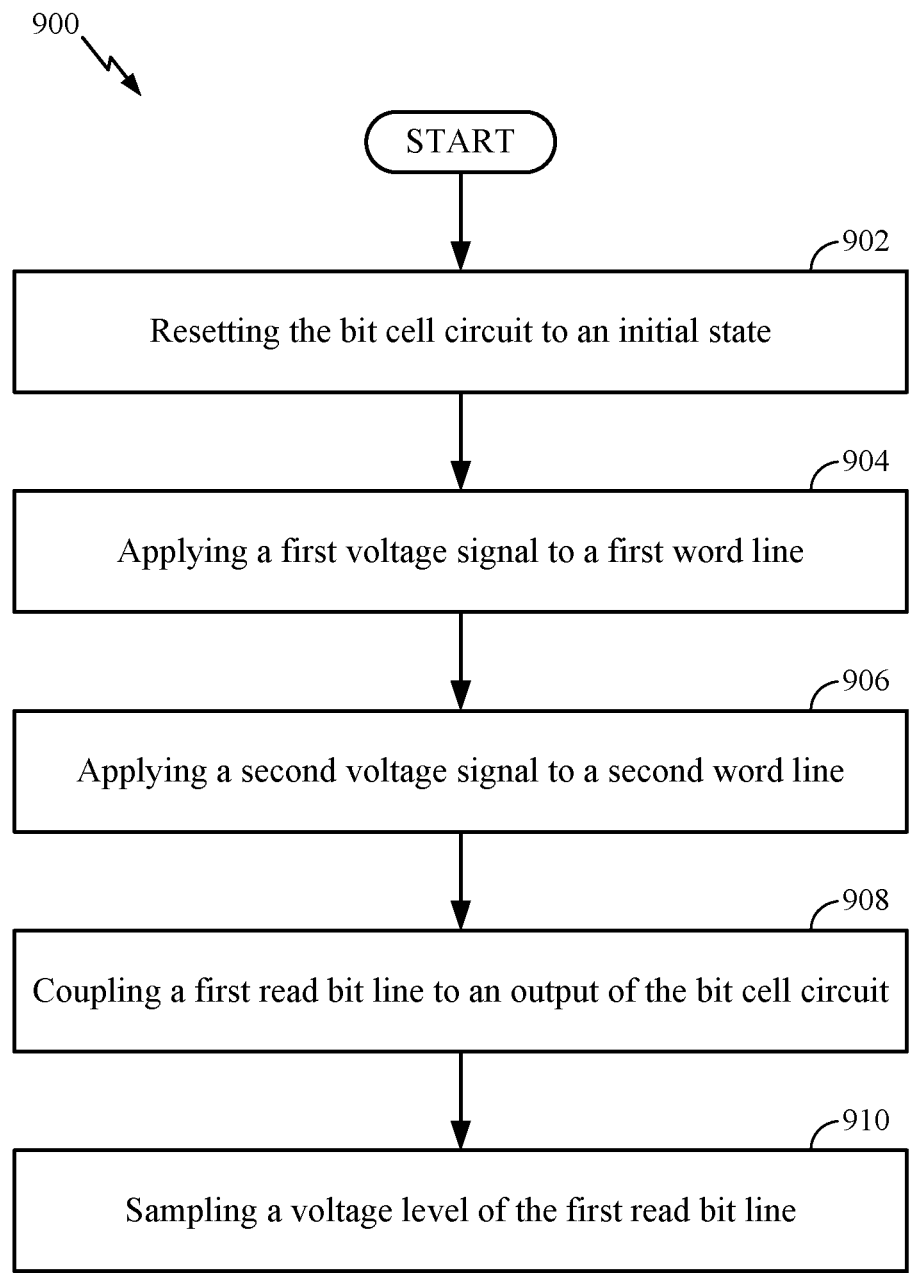
FIG. 9 illustrates an exemplary partial method for operating a bit cell circuit in accordance with some examples of the disclosure.

FIG. 9 illustrates an exemplary partial method for operating a bit cell circuit in accordance with some examples of the disclosure. As shown in FIG. 9, the partial method 900 begins in block 902 with resetting the bit cell circuit to an initial state. The partial method 900 continues in block 904 with applying a first voltage signal to a first signal line. The partial method 900 continues in block 906 with applying a second voltage signal to a second signal line. The partial method 900 continues in block 908 with coupling a first read bit line to an output of the bit cell circuit. The partial method 900 concludes in block 910 with sampling a voltage level of the first read bit line.

Figure 10:
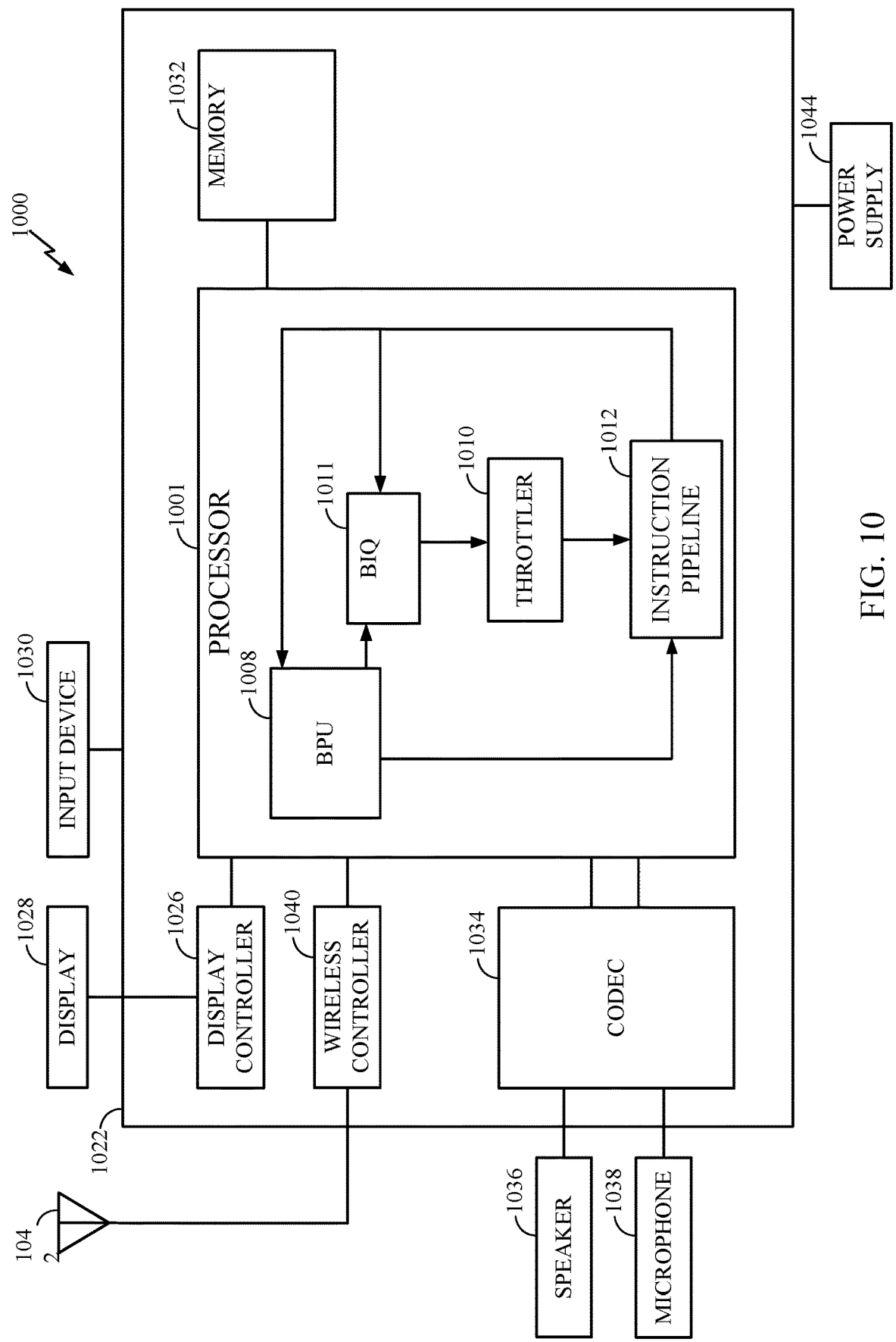
FIG. 10 illustrates an exemplary mobile device in accordance with some examples of the disclosure.

FIG. 10 illustrates an exemplary mobile device in accordance with some examples of the disclosure. Referring now to FIG. 10, a block diagram of a mobile device that is configured according to exemplary aspects is depicted and generally designated 1000. In some aspects, mobile device 1000 may be configured as a wireless communication device. As shown, mobile device 1000 includes processor 1001, which may be configured to implement the methods described herein in some aspects. Processor 1001 is shown to comprise instruction pipeline 1012, buffer processing unit (BPU) 1008, branch instruction queue (BIQ) 1011, and throttler 1010 as is well known in the art. Other well-known details (e.g., counters, entries, confidence fields, weighted sum, comparator, etc.) of these blocks have been omitted from this view of processor 1001 for the sake of clarity.

Processor 1001 may be communicatively coupled to memory 1032 over a link, which may be a die-to-die or chip-to-chip link. Mobile device 1000 also include display 1028 and display controller 1026, with display controller 1026 coupled to processor 1001 and to display 1028.

In some aspects, FIG. 10 may include coder/decoder (CODEC) 1034 (e.g., an audio and/or voice CODEC) coupled to processor 1001; speaker 1036 and microphone 1038 coupled to CODEC 1034; and wireless controller 1040 (which may include a modem) coupled to wireless antenna 1042 and to processor 1001.

In a particular aspect, where one or more of the above-mentioned blocks are present, processor 1001, display controller 1026, memory 1032, CODEC 1034, and wireless controller 1040 can be included in a system-in-package or system-on-chip device 1022. Input device 1030 (e.g., physical or virtual keyboard), power supply 1044 (e.g., battery), display 1028, input device 1030, speaker 1036, microphone 1038, wireless antenna 1042, and power supply 1044 may be external to system-on-chip device 1022 and may be coupled to a component of system-on-chip device 1022, such as an interface or a controller.

It should be noted that although FIG. 10 depicts a mobile device, processor 1001 and memory 1032 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 11:
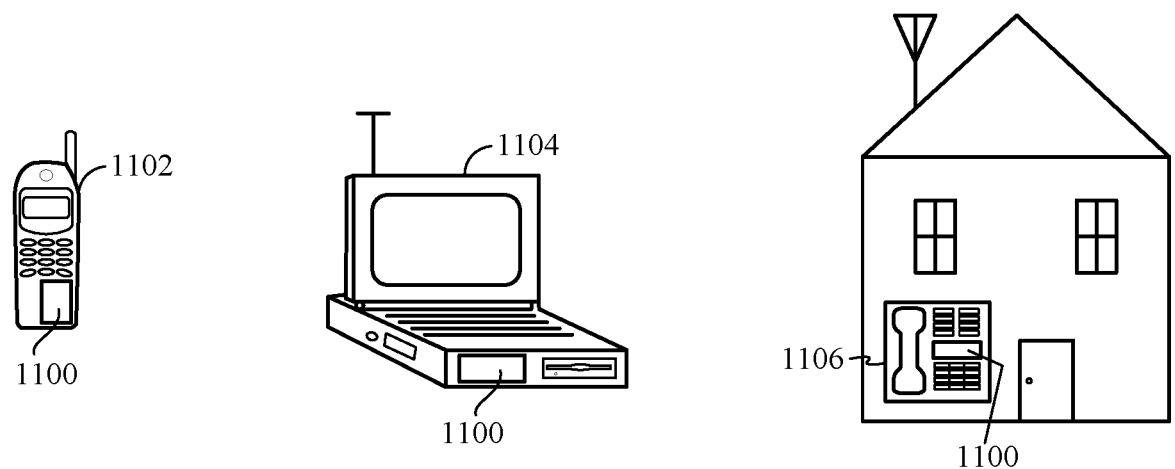
FIG. 11 illustrates various electronic devices that may be integrated with any of the aforementioned integrated device, semiconductor device, integrated circuit, die, interposer, package or package-on-package (PoP) in accordance with some examples of the disclosure.

FIG. 11 illustrates various electronic devices that may be integrated with any of the aforementioned integrated device, semiconductor device, integrated circuit, die, interposer, package or package-on-package (PoP) in accordance with some examples of the disclosure. For example, a mobile phone device 1102, a laptop computer device 1104, and a fixed location terminal device 1106 may include an integrated device 1100 as described herein. The integrated device 1100 may be, for example, any of the integrated circuits, dies, integrated devices, integrated device packages, integrated circuit devices, device packages, integrated circuit (IC) packages, package-on-package devices described herein. The devices 1102, 1104, 1106 illustrated in FIG. 11 are merely exemplary. Other electronic devices may also feature the integrated device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, an apparatus may comprise a semiconductor means (see, e.g., 624 in FIG. 6), a means for encapsulating, or an encapsulant means (see, e.g., 620 in FIG. 6), disposed around the semiconductor means, wherein a backside surface of the semiconductor means is exposed. Such an apparatus may further include a means for conducting (e.g., conductive layer 626) coupled to the semiconductor means, the means for conducting comprising a plurality of conductive pillar bumps, wherein a bump density of the plurality of conductive pillar bumps is greater than 5%. The means for encapsulating, or encapsulant means, may be further disposed between the plurality of conductive bumps using a MUF process. It will be appreciated that the aforementioned aspects are merely provided as examples and the various aspects claimed are not limited to the specific references and/or illustrations cited as examples.

One or more of the components, processes, features, and/or functions illustrated in FIGS. 1-11 may be rearranged and/or combined into a single component, process, feature or function or incorporated in several components, processes, or functions. Additional elements, components, processes, and/or functions may also be added without departing from the disclosure. It should also be noted that FIGS. 1-11 and its corresponding description in the present disclosure is not limited to dies and/or ICs. In some implementations, FIGS. 1-11 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or a plurality of claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A bit cell circuit comprising:
a bit cell coupled to a system voltage and a ground;
a first signal line coupled to the bit cell;
a second signal line coupled to the bit cell;
a third signal line coupled to the bit cell;
a fourth signal line coupled to the bit cell;
a read transistor coupled to a first read signal line, an output of the bit cell, and a first read bit line; and
a capacitor directly coupled to the bit cell output and the ground.

2. The bit cell circuit of claim 1, wherein the bit cell comprises a first transistor coupled to the first signal line, a second transistor coupled to the second signal line, a third transistor coupled to the third signal line, and a fourth transistor coupled to the fourth signal line.

3. The bit cell circuit of claim 2, wherein the bit cell comprises four transistors configured as a first inverter and a second inverter to perform a latch function on a data bit.

4. The bit cell circuit of claim 2, wherein the first transistor is a P type transistor, the second transistor is a P type transistor, the third transistor is an N type transistor, and a fourth transistor is an N type transistor.

5. The bit cell circuit of claim 1, wherein the read transistor is an N type transistor.

6. The bit cell circuit of claim 1, wherein the bit cell circuit is configured to perform a XNOR operation on the first signal line, the second signal line, the third signal line, and the fourth signal line.

7. The bit cell circuit of claim 1, wherein the bit cell circuit is a charge sharing static random access memory in a compute in memory array of a neural network.

8. The bit cell circuit of claim 1, wherein the capacitor provides a path to ground to prevent the output from floating.

9. The bit cell circuit of claim 1, wherein the bit cell circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

10. A bit cell circuit comprising:
a bit cell coupled to a system voltage and a ground;
a first signal line coupled to the bit cell;
a second signal line coupled to the bit cell;
a third signal line coupled to the bit cell;
a fourth signal line coupled to the bit cell;
a read transistor coupled to a first read signal line, an output of the bit cell, and the ground; and
a capacitor coupled to the bit cell output and the read bit line.

11. The bit cell circuit of claim 10, wherein the bit cell comprises a first transistor coupled to the first signal line, a second transistor coupled to the second signal line, a third transistor coupled to the third signal line, and a fourth transistor coupled to the fourth signal line.

12. The bit cell circuit of claim 11, wherein the bit cell comprises four transistors configured as a first inverter and a second inverter to perform a latch function on a data bit.

13. The bit cell circuit of claim 11, wherein the first transistor is a P type transistor, the second transistor is a P type transistor, the third transistor is an N type transistor, and a fourth transistor is an N type transistor.

14. The bit cell circuit of claim 10, wherein the read transistor is an N type transistor.

15. The bit cell circuit of claim 10, wherein the bit cell circuit is configured to perform a XNOR operation on the first signal line, the second signal line, the third signal line, and the fourth signal line.

16. The bit cell circuit of claim 10, wherein the bit cell circuit is a charge sharing static random access memory in a compute in memory array of a neural network.

17. The bit cell circuit of claim 10, wherein the capacitor provides a path to ground to prevent the output from floating.

18. The bit cell circuit of claim 10, wherein the bit cell circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

19. A bit cell circuit comprising:
a bit cell coupled to a system voltage and a ground;
a first signal line coupled to the bit cell;
a second signal line coupled to the bit cell;
a third signal line coupled to the bit cell;
a fourth signal line coupled to the bit cell;
a read transistor coupled to a first read signal line, an output of the bit cell, and a write bit line bar;
a write bit line coupled to third signal line and the fourth signal line; and a capacitor coupled to the bit cell output and the read bit line.

20. The bit cell circuit of claim 19, wherein the bit cell comprises a first transistor coupled to the first signal line, a second transistor coupled to the second signal line, a third transistor coupled to the third signal line, and a fourth transistor coupled to the fourth signal line.

21. The bit cell circuit of claim 20, wherein the bit cell comprises four transistors configured as a first inverter and a second inverter to perform a latch function on a data bit.

22. The bit cell circuit of claim 20, wherein the first transistor is a P type transistor, the second transistor is a P type transistor, the third transistor is an N type transistor, and a fourth transistor is an N type transistor.

23. The bit cell circuit of claim 19, wherein the read transistor is an N type transistor.

24. The bit cell circuit of claim 19, wherein the bit cell circuit is configured to perform a XNOR operation on the first signal line, the second signal line, the third signal line, and the fourth signal line.

25. The bit cell circuit of claim 19, wherein the bit cell circuit is a charge sharing static random access memory in a compute in memory array of a neural network.

26. The bit cell circuit of claim 19, wherein the capacitor provides a path to ground to prevent the output from floating.

27. The bit cell circuit of claim 19, wherein the bit cell circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

28. A method for operating a bit cell circuit, the method comprising:
   resetting the bit cell circuit to an initial state;
   applying a first voltage signal to a first signal line;
   applying a second voltage signal to a second signal line;
   coupling a first read bit line to an output of the bit cell circuit; and
   sampling a voltage level of the first read bit line.

29. The method of claim 28, wherein the resetting the bit circuit to the initial state comprises coupling the first read bit line to a ground and coupling a first read signal line to a system voltage.

30. The method of claim 29, wherein the first voltage signal and the second voltage signal correspond to a desired input state for a MAC operation.

\* \* \* \* \*